US011448672B2

(12) United States Patent
Agarwal et al.

(10) Patent No.: US 11,448,672 B2
(45) Date of Patent: Sep. 20, 2022

(54) SMART ENERGY METER HOUSING (71) Applicant: HONEYWELL INTERNATIONAL INC., Charlotte, NC (US)

(72) Inventors: Nitin Agarwal, Faridabad (IN); Murali Krishna Bezawada, Gurgaon (IN); Murajith Menon, Bangalore (IN); Krishna Mohan, Hyderabad (IN); Suresh Kumar Palle, Bangalore (IN); Ganesh Patil, Gurgaon (IN); Vidyadhar Patwardhan, Gurgaon (IN); S Piramanayagam, Bangalore (IN); Shalu Singhvi, Bangalore (IN)

(73) Assignee: Honeywell International Inc., Charlotte, NC (US)

( * ) Notice: Subject to any disclaimer, the term of this patent is extended or adjusted under 35 U.S.C. 154(b) by 107 days.

(21) Appl. No.: 17/122,713

(22) Filed: Dec. 15, 2020

(65) Prior Publication Data
US 2022/0187348 A1  Jun. 16, 2022

(51) Int. Cl.
*G01R 22/06* (2006.01)
*H05K 5/02* (2006.01)
*G01R 29/12* (2006.01)
*G06Q 50/06* (2012.01)

(52) U.S. Cl.
CPC ........... *G01R 22/065* (2013.01); *G01R 29/12* (2013.01); *H05K 5/0208* (2013.01); *G06Q 50/06* (2013.01)

(58) Field of Classification Search
CPC .. G01R 22/00; G01R 22/06–10; G01R 29/00; G01R 29/12; H05K 5/00; H05K 5/02; H05K 5/0208
See application file for complete search history.

(56) References Cited

U.S. PATENT DOCUMENTS

| 6,280,805 | B1* | 8/2001 | Markovich | G01R 11/04 |
| | | | | 428/34.1 |
| 6,559,380 | B2* | 5/2003 | Soboleski | H02G 3/14 |
| | | | | 174/67 |
| 6,583,359 | B1* | 6/2003 | Cabello-Colon | H02G 3/14 |
| | | | | 174/67 |
| 8,325,486 | B2 | 12/2012 | Arshad et al. | |

(Continued)

FOREIGN PATENT DOCUMENTS

| CN | 210181097 U | 3/2020 |
| IN | 3814/DEL/2012 | 6/2013 |

*Primary Examiner* — Douglas X Rodriguez
*Assistant Examiner* — David B Frederiksen
(74) *Attorney, Agent, or Firm* — Paschall & Associates, LLC; James C. Paschall (57) ABSTRACT

A meter case used with a utility meter is disclosed. The meter shell includes a plurality of snap fit joints assembled on the meter case arranged to engage a module cover to mount the module cover to the meter shell. The module cover further includes wire housing formed along an inner periphery of the module cover that houses a wire having a first end and a second end therein. A metal shield placed behind the meter shell is electrically coupled to a first connector. A terminal electrically connected to the metal shield is arranged to discharge current to ground. An electrical contact electrically coupled to the second end of the wire is arranged to engage the first connector to establish an electrical connection to the metal shield for the discharge to ground of electrostatic currents sensed by wire.

20 Claims, 6 Drawing Sheets

(56) References Cited

U.S. PATENT DOCUMENTS

| | | | |
|---|---|---|---|
| 9,341,610 B1* | 5/2016 | McIver | G01R 31/25 |
| 2009/0031643 A1* | 2/2009 | Allen | E04H 1/1238 |
| | | | 52/741.3 |
| 2010/0036624 A1* | 2/2010 | Martin | G01R 22/10 |
| | | | 324/142 |
| 2011/0006058 A1* | 1/2011 | Kuhn | B65F 1/1426 |
| | | | 220/9.4 |

* cited by examiner

SMART ENERGY METER HOUSING

TECHNICAL FIELD

This disclosure is generally directed to the field of energy metering systems and smart meters. More specifically, it relates to a modular smart meter having an electrostatic discharge circuit built into the meter cover.

BACKGROUND

A utility meter generally measures electric, water, or gas consumption by customers of a utility company. Smart utility meters measure consumption using digital technology and provide a convenient method for transmitting usage measurements in the form of digital data directly back to the utility company, without the need to have service worker visit the location of the meter and read consumption data on a meter dial or display. The smart utility meter can use any convenient communications network, such as for example, a wireless, wired or cellular communications networks to send usage measurements data back to a utility company for billing purposes. The smart meter can also transmit data to the utility company regarding the operation of the meter. Smart utility meters are also adapted to be shut-off remotely, to suspend the delivery of utility services by the utility company, under certain conditions, such as to facilitate load balancing, emergency shut-offs and other service suspensions.

Electrical power theft is a common and persistent problem in many countries. In some countries, a large percentage of the total electrical power generated by utility companies is lost due to theft of the electrical power by the unauthorized tampering of an electrical meter. Users have been known to tamper with their electrical meters, causing them to under record power usage, as well disrupt their operation by disconnecting and/or bypassing the meter.

Smart meters come with in-built anti-tamper features, so that power theft can be detected and if necessary, corrective actions taken. A very common method for tampering with a smart electrical meter is by way of subjecting the meter to a high voltage discharge in the form of an electrical spark. This electrical spark is introduced by a device arranged to generate high voltage sparks that can be applied to and discharged into the meter. To render such high voltage sparks ineffective, an electrostatic discharge (ESD) circuit is generally provided within the meter. The ESD circuit bypasses the damaging electrical currents to ground. The ESD protection circuits are typically located in the electronics section of a smart meter which also houses a smart meter's communication module. The utility companies may from time to time have a need to upgrade/modify or change the communications module. When the communications module is upgraded modified or changed, the outer casing needs to be removed and this may expose the ESD circuit to a service technician.

Accordingly, the need arises to selectively maintain a detachable communications module cover with a built in ESD circuit which does not expose the ESD circuit to a service technician, while accessing the communications module.

SUMMARY

Some of the objects and advantages of the invention will now be set forth in the following description, while other objects and advantages of the invention may be obvious from the description, or may be learned through practice of the invention.

In accordance with an exemplary embodiment, a meter case used with a utility meter is disclosed comprising, including a plurality of snap fit joints assembled on the meter case. A module cover is configured to be mounted on the meter shell by engaging the plurality of snap fit joints, the module cover further including a wire housing formed along an inner periphery of the module cover. A wire having a first end and a second end, is mounted within the wire housing. A metal shield, is placed behind the meter shell, the metal shield is electrically coupled to a first connector. A terminal electrically connected to the metal shield, is configured to discharge current to ground. The meter case is further provided with an electrical contact, electrically coupled to the second end of the wire, the electrical contact is configured to engage the first connector to establish an electrical connection to the metal shield for the discharge to ground of electrostatic discharge current sensed by wire. An electrical contact insulation chamber formed within the module cover of the meter case, for housing the electrical contact, the electrical contact insulation chamber is provided with a recess.

In accordance with another exemplary embodiment, a method for assembling a case used with a utility meter is disclosed. The method comprises providing a plurality of snap fit joints on a meter shell and mounting a module cover on the meter shell by engaging the plurality of snap fit joints, the module cover having a wire housing formed along an inner periphery of the module cover. The method further includes laying a wire having a first end and a second end, within the wire housing along the inner periphery of the module cover, and coupling electrically a metal shield placed behind the meter shell, to a first connector. The method also includes providing a terminal electrically connected to the metal shield configured to discharge current to ground, and providing an electrical contact electrically coupled to the second end of the wire, the electrical contact configured to engage with the first connector to establish an electrical connection to the metal shield for the discharge to ground of electrostatic discharge current sensed by the wire. Lastly the method provides for forming of an electrical contact insulation chamber within the module cover, where the insulation chamber providing a recess to house the electrical contact.

In accordance with another exemplary embodiment, a metering system is provided. The metering system comprises, a communication module configured to transmit and receive data from the network grid and a meter shell comprising a plurality of snap fit joints. The metering system also provides a module cover configured to shield the communication module, and is mounted on the meter case by engaging the plurality of snap fit joints. The module cover has a wire housing formed along an inner periphery of the module cover. The metering system also provides a wire having a first end and a second end, mounted within the wire housing. A metal shield is placed behind the meter shell, the metal shield that is electrically connected to a first connector through a tail end of a spring. The metering system also has a terminal electrically connected to the metal shield configured to discharge current to ground and an electrical contact electrically coupled to the second end of the wire, the electrical contact is configured to engage the first connector to establish an electrical connection to the metal shield for the discharge to ground of electrostatic discharge current sensed by wire. Further, an electrical contact insulation chamber formed within the module cover, for housing the electrical contact, the electrical contact insulation chamber having a recess.

Other technical features may be readily apparent to one skilled in the art from the following figures, descriptions, and claims.

BRIEF DESCRIPTION OF DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The figures, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

The disclosed embodiments relate to metering systems and methods for monitoring consumption of a commodity, such as electricity. It is understood that the systems and methods described herein may be implemented in systems that monitor consumption of other commodities, such as, for example, water or gas. In one embodiment, the metering system can include a plurality of meters communicatively connected to a head-end system. Such a connection may be a physical connection such as a cable between the meter and the head-end system, a wireless RF connection, or by other convenient means of communication.

The increasing demand for energy and the use of finite resources for energy production have led to the use of increased technology for the production, transmission, distribution and consumption of energy in order to make, distribute and use energy more efficiently and wisely. To that end, utility service providers, i.e. the utility companies have begun employing information technology systems integrated with their energy production, transmission, distribution and metering systems to enable more efficient monitoring and operation of such systems.

Smart meters have the ability to issue notifications to a control system. During communication, the control system will function to log and record various events, errors, and/or warnings in the plurality of meters. These events, errors, and/or warnings may be recorded in tables and stored in a meter memory. The tables may be accesses and/or sent to the control system and verified.

Figure 1A:
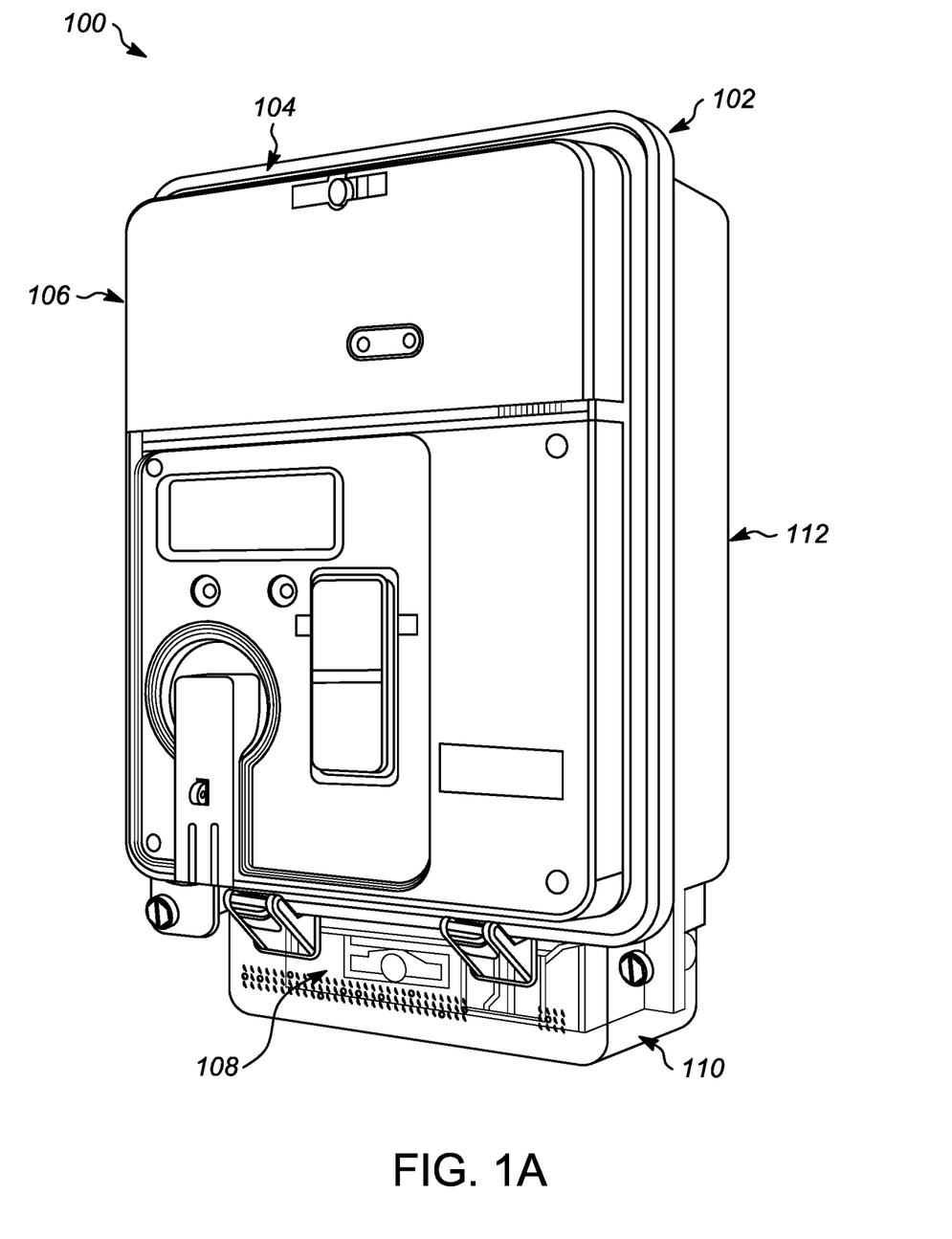
FIG. 1A illustrates a smart meter, in accordance with an exemplary embodiment.

FIG. 1A illustrates a smart meter 100 in accordance with an embodiment of the present invention. The smart meter 100 can include a meter shell 102, a communication module 104, a communication module cover 106, a plurality of terminals 108, a terminal cover 110, and a base 112. The communication module 104 can form the upper portion of the smart meter 100. The communication module 104 may be implemented as a removeable unit arranged to communicate both internally and externally of the communication periphery where the smart meter 100 is installed. Externally of the communication periphery, the communication module 104 can use a Wide Area Network (WAN) to transmit and receive data regarding meter readings to a utility company. Within or internally to the periphery, the communications module 104 may use a Local Area Network (LAN) to communicate with other smart meters located within the communication periphery. The communication module 104 may communicate through WAN or LAN using wireless technologies.

The communication module 104 can function to make remote meter readings at configurable intervals, such as for example, time of the day metering, and pre-paid service delivery that enable the meter to function on a rechargeable basis. The communication module can also function to provide messaging of an alarm event, remote load connection, disconnection based on demand, remote firmware upgrade, integration with utility software for billing collections, import of legacy data from existing models and lastly security features. The communication module 104 can accurately maintain system time synchronization across all functions to ensure accuracy of data. The communication module 104 can also support interfacing the smart meter with Smart Grid functionalities such as for example, an outage management system, distribution automation including a self-healing system, distribution transformer monitoring units, distributed energy resources and multiple executable applications. The communication infrastructure used by the communication module 104 can also include, but is not limited to, an RF mesh network/PLC or cellular network or a combination of these. The communication network may be based on suitable standards that are prevalent in the industry.

The lower portion of the smart meter 100 can include a terminal box having a plurality of terminals 108, and a terminal cover 110. The plurality of terminals 108 can be used for establishing phase connections. Phase wiring may be connected to the terminals for establishing the phase connections. The terminal cover 110 encapsulates the plurality of terminals 108 and the metal wiring, thus protecting these components from any unauthorized access. The terminal cover 110 may be hinged at the bottom of the middle portion of the smart meter 100. The base 112 forms the lower housing of the smart meter and all meter components are configured to be housed within the base 112.

Figure 1B:
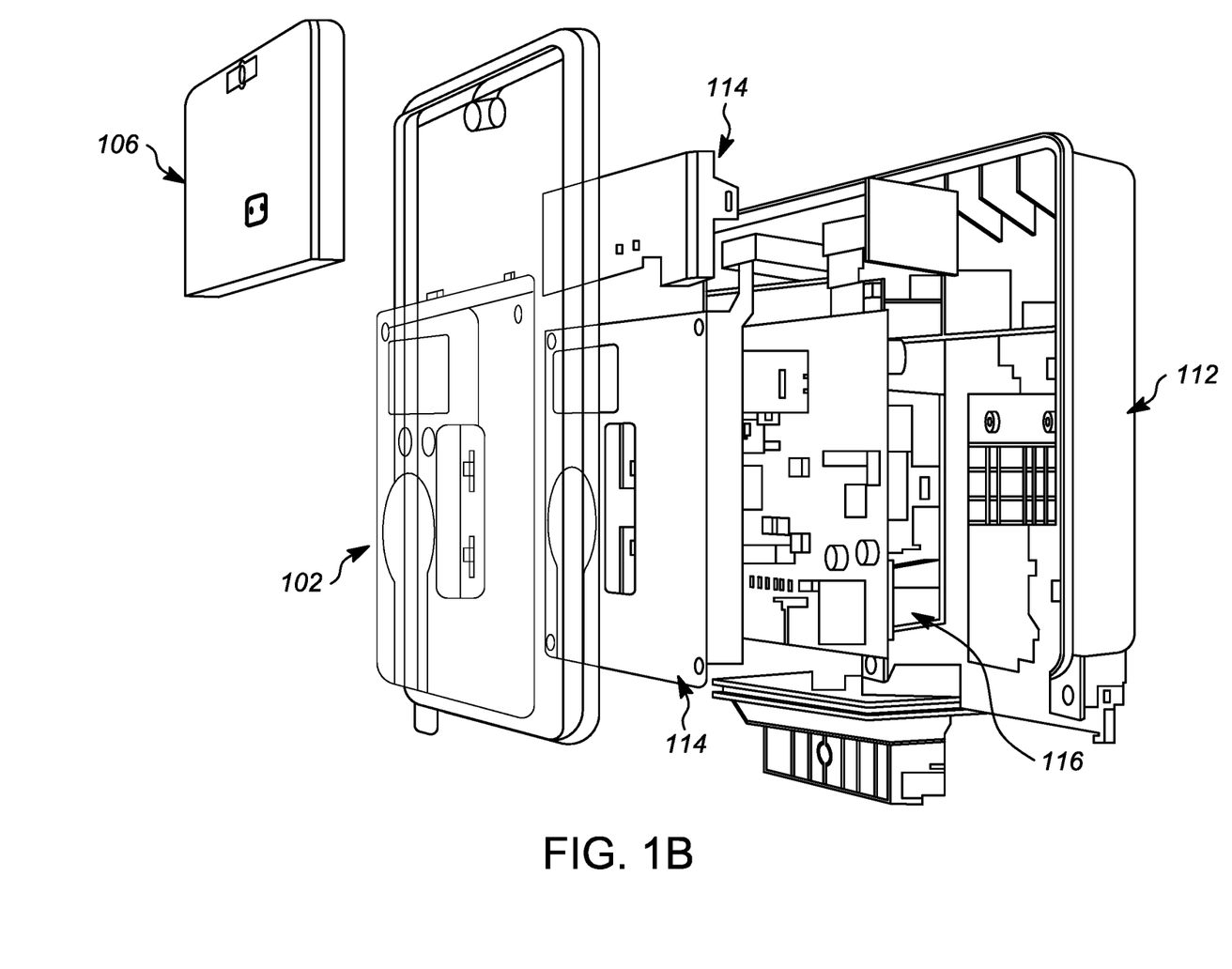
FIG. 1B illustrates an exploded view of the smart meter, in accordance with an exemplary embodiment.

An embodiment of the smart meter is addressed in an exploded view of the smart meter 100 in FIG. 1B. The exploded view depicted in FIG. 1B illustrates the base 112, the plurality of terminals 108, the communication module 104, a metal shield 114, a communication module cover 106, a circuit board 116 and the meter case 102.

The base 112 can form the housing within which the communication module 104 may be housed. The base 112 can protect the communication module 104 from being damaged. The base 112 also has mounts, which can be used for mounting the smart meter to a wall, a pole or any convenient mounting device. The base 112 is typically fastened to a rear portion of the meter shell 102.

Various design changes to the base 112, may be made to render the smart meter mountable in a variety of ways at plurality of locations. The base 112, may be provided with a plurality of slots, holes or other penetrations, required to effectively mount the smart meter ate a desired mounting area, using various forms of mounting methods employing fasteners.

As shown in FIG. 1B, the smart meter 100 includes multiple printed circuit boards. At least one multi-layer electronic circuit board 116 may be mounted through sockets on the base 112 of the smart meter 100 and may be oriented in a vertical plane. The electronic board 116, includes various components responsible for the functioning of the smart meter.

The electronic board 116 is mounted within the base and behind the metal shield 114. The electronic board 116 as used herein functions to measure energy consumption at a service location that the smart meter 100 is installed for example, a user household, or a commercial enterprise.

The electronic board 116 is further arranged to send data of the energy consumed by a user to the communication module for transmission to the utility. The electronic board 116, is access-protected through a seal, that is configured to record breaking of the seal and to report such a tamper to the utility company via the communication module 104.

The metal shield 114 can be connected to the base 112 via screws and snap fit joints. The metal shield 114 is further arranged protect the circuit board 116 and other electronic components, from any externally applied force. A meter shell 102 is assembled over the metal shield 114 and is attached to base 112. The meter shell 102 therefore covers the metal shield 114 and also prevent any access to the metal shield 114.

The meter shell 102 may be made of a transparent material, and forms the topmost layer in the smart meter. The meter shell 102 can include the display screens, dials, readouts, optical ports and seals, among other required measuring equipment. The meter shell 102 can be attached to the base 114 of the smart meter 100 via snap fit joints. Any attempt to remove the meter shell 102 without authorization may result in breaking of the snap fit joints, resulting in damage to the smart meter 100 itself.

Figure 2:
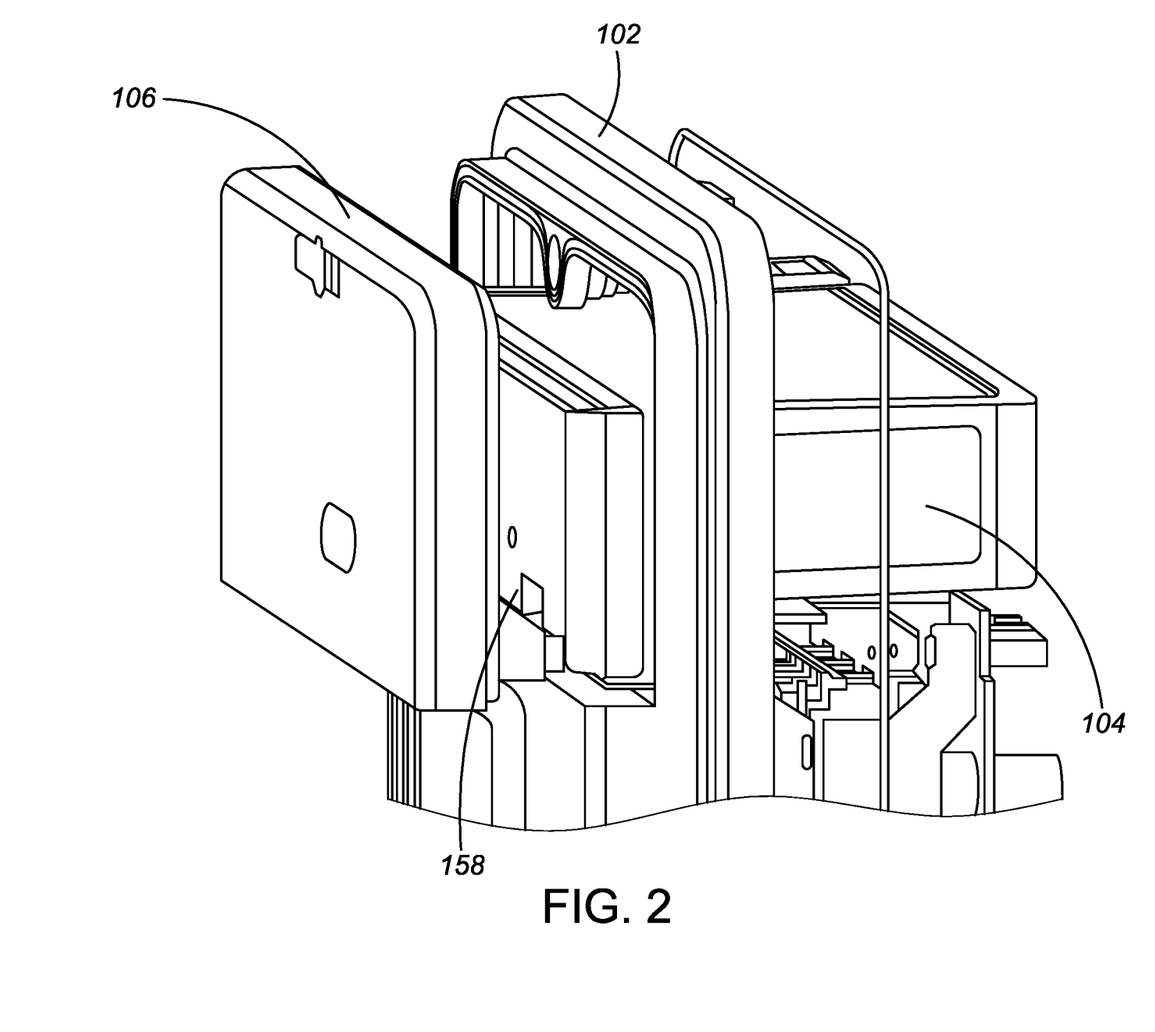
FIG. 2 illustrates an isometric view of the smart meter shown in FIG. 1A, with a meter shell, a metal shield, a communications module and a base, in accordance with an exemplary embodiment.

FIG. 2 illustrates an isometric view of the smart meter 100 in accordance with an embodiment of the present disclosure. FIG. 2 illustrates the meter shell 102, the communications module 104, the communication module cover 106 and a plurality of snap fit joints 2088.

As was explained earlier, the meter shell 102 is attached to the base 112, and forms a flush outer shell of the smart meter. The meter shell 102 covers the metal shield 114, the circuit board 116 and all other internal elements of the smart meter and their connections. The meter shell 102 may have various constructional elements formed thereupon as per the requirement of the utility companies, such as for example dial readouts, displays or connector ports.

The meter shell 102, is attached to the base 112 with a plurality of mounts. As used herein, a "mount" refers to any sealing feature that enables coupling and/or sealing of the meter shell 102 to the base 112, including, protuberances, projections, and/or recessed features. The communication module cover 106, is configured to enclose the communication module 104, such that it may not be accessible. The communication module cover 106 is detachably coupled to the meter shell 102, with a plurality of snap fit joints 208.

The operator may detach the communication module cover 106, to gain access to the communication module 104 in order to obtain data, upgrade the communication module 104 or to perform any modification to the module. The plurality of snap fit joints 208, are configured to disengage from the meter shell 102, allowing the communication module cover 106 to be separated and detached from the meter shell. The operator detaches the communication module cover 106 from the meter by releasing the snap fit joints 208 from corresponding cavities formed within the meter shell.

Meter cover 106 forms a one-piece enclosure that functions to provide a form-fitting tamper-proof cover. The meter cover 106 may also be provided with a lock device to prevent unauthorized access to the communication module. However, the communications module can still be prone to tampering by the introduction of an electrical discharge in the form of a spark introduced on or around the communications module cover 106. Such an electrical discharge may hinder the operation of the energy meter components or the communications module.

Figure 3A:
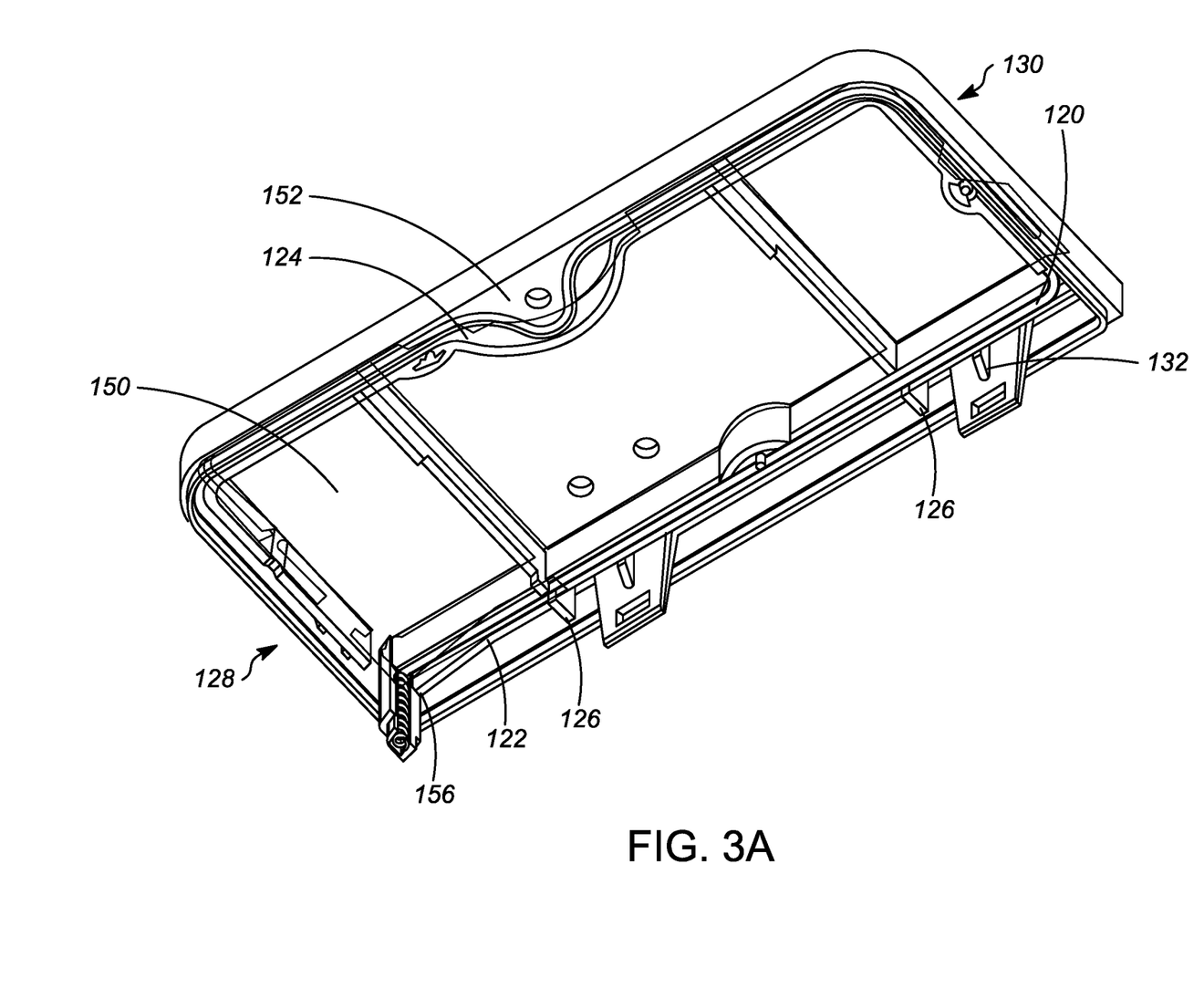
FIG. 3A illustrates an isometric view of a communications module cover, in accordance with an exemplary embodiment.

FIG. 3A illustrates the interior side 150 of communication module cover 106. The interior side 150 of the communication module cover 106, includes a wire 120, a wire housing 122, a plurality of grooves 124 and a plurality of locks 126. The communication module cover 106, is mounted and detached with the help of snap fit joints 132 provided therein. The snap fit joints 132 engage with the snaps provided on the meter case when the communication module cover 106 is mounted on the meter shell 102.

The communication module cover 106, may also be provided with a bolt socket 152 for securely bolting the communication module to the meter shell 102. The communication module cover 106 is further provided with a wire housing 122 formed within its inner periphery. The wire housing 122 is formed along the inner periphery as a groove, establishing a path for the wire 120.

The wire housing 122 is comprised of a top portion that includes shoulder projections and a bottom portion having a plurality of grooves 124. The shoulder projections fitting into the plurality of grooves 124 to couple the top portion to the bottom portion. The wire 120, is placed into and is received by the wire housing 122, extending from a left side wall 128 of the wire housing to right side wall 130. The plurality of locks 126 are provided within the wire housing 122. The plurality of locks 126 and plurality of grooves 124 arrest the movement of the wire 120 placed within wire housing 122.

The wire 120 is mounted within the wire housing 122, beginning from the left side wall 128 of the communication module cover 106 through along the wire housing 122 to the right-hand side wall 130. The wire 120 is then placed into an electrical contact insulation chamber 134. The wire 120, forms a part of the ESD path for discharging current to ground.

Figure 3B:
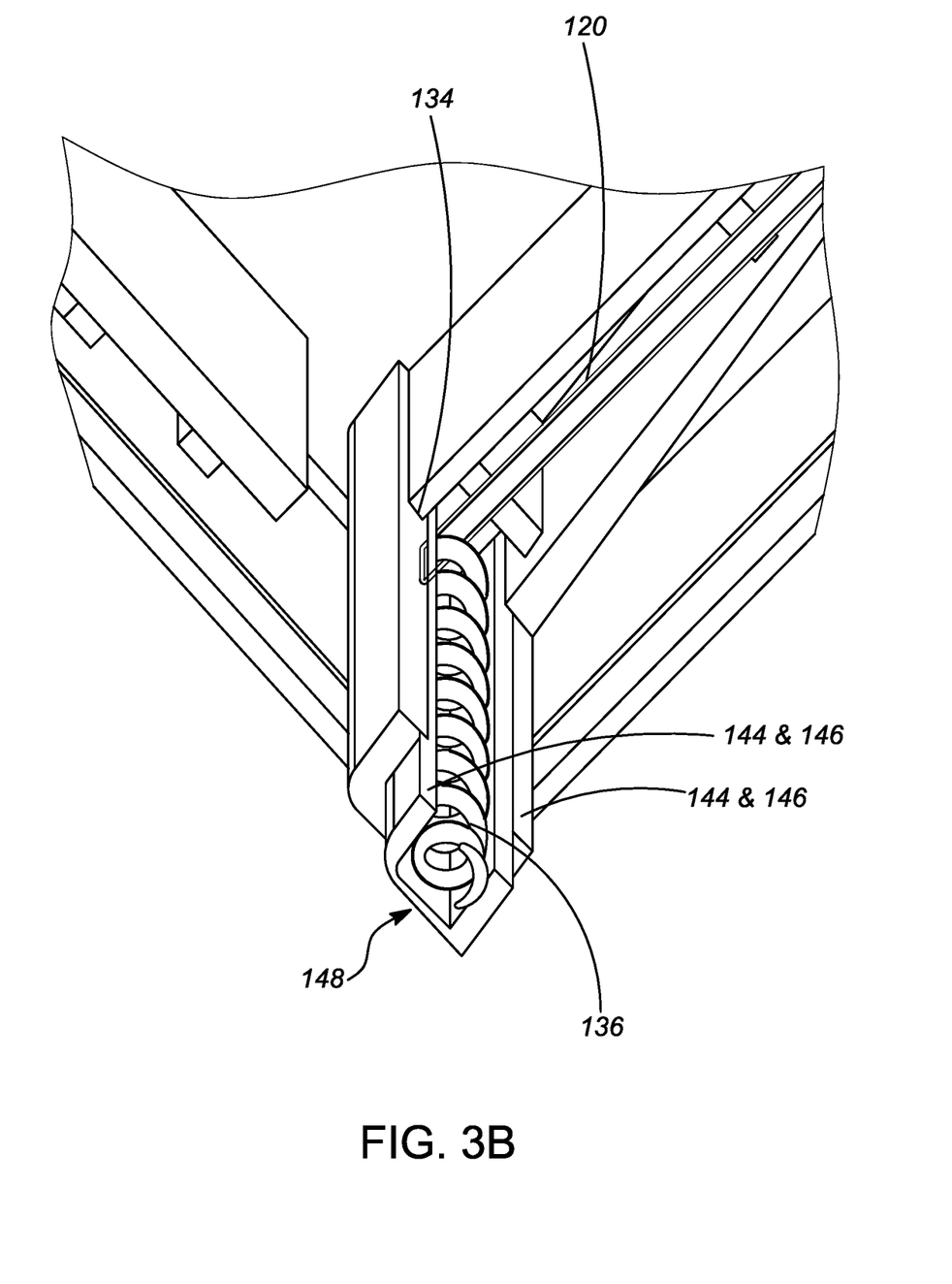
FIG. 3B illustrates a sectional view of the communications module cover, in accordance with an exemplary embodiment.

As can be best seen in FIG. 3B, the electrical contact insulation chamber 134 may be formed at an end portion 156 of the right-hand side wall 130 of the communication module cover 106. Alternatively, the electrical contact insulation chamber 134 can also be formed at the end of the right-hand side wall 130, however, in this assembly, the wire 120 is mounted within the communication module cover 106 beginning from the right-hand side wall 130 of the communication module cover 106. The electrical contact insulation chamber 134, therefore may be formed at either end of the side wall 128 or the side wall 130.

The electrical contact insulation chamber 134 comprises of a first and a second elongated rails 144 and 146, and a base panel 148. Elongated rails 144 and 146 are formed as side boundaries of the electrical contact insulation chamber 134. The base panel 148 of the electrical contact insulation chamber 134 comprises of an electrically non-conductive C shaped plate having a bottom surface, a top surface and a side surface. The rails 144 and 146, may be configured to receive the base panel 148. The base panel 148 may be configured to slide vertically within the rails 144 and 146. The rails 144 and 146, allow the forward and backward movement of the base panel 148, along with the movement of the electrical contact portion 136. The base panel 148 may be constructed of any electrically insulated material. The base panel 148 guides the electrical contact portion 136 by moving or working with the electrical contact when the communication module cover 106 is mounted on the meter case 102.

The base panel 148 is formed within the rails such that the base panel may extend outwards from the rails 144 and 148. The electrical contact insulation chamber 134, houses the electrical contact portion 136 as illustrated in FIG. 3B. As shown in the figure the electrical contact insulation chamber 134 is formed as a protrusion from the communication module cover 106, where the panel 140 protrudes outwards from the communication module 104.

More specifically an electrical contact portion 136 formed at one end of the wire 120 is housed within the base panel 148 of the electrical contact insulation chamber 134. The base panel 148 is formed to cover the electrical contact portion 136. The electrical contact insulation chamber 134 prevents any form of access to the electrical contact portion 136, by an authorized service technician or by any other operator. The base panel 148 guides the horizontal movement of the electrical contact portion 136, in such a way that the electrical contact portion 136 moves vertically backwards, when the communication module cover 104 is mounted in the meter case 102.

The electrical contact insulation chamber 134, is configured to pass through the meter shell 102 and engage with the metal shield 114, when the communication module cover 106 is mounted on the meter shell 102. The electrical contact insulation chamber 134 passes through the meter shell 102 and extends the electrical contact portion 136 towards the metal shield 114.

The electrical contact portion 136 is shown as a structure formed at one end of the wire 120. However, the electrical contact portion 136 can also be formed as a separate structure that is electrically connected to an end of the wire 120. In such as a construction the electrical connection of the wire 120 and wire 120 is formed within the electrical contact insulation chamber 134. The electrical contact portion 136 comprises a coil spring and a tail end 138. The coil spring forming a part of the electrical contact portion 136, is housed within a recess formed in the base panel 148, the recess is molded within the base panel 148 of the electrical contact insulation chamber 134.

The tail end 138 is formed as an end of the coil spring, at the edge of the base panel 148. The coil spring is configured to compress when the communication module cover 106 is mounted on the meter case 102. The base panel 148 may be configured to slide within the rail 144 and 146, with the movement of the coil spring.

Figure 4:
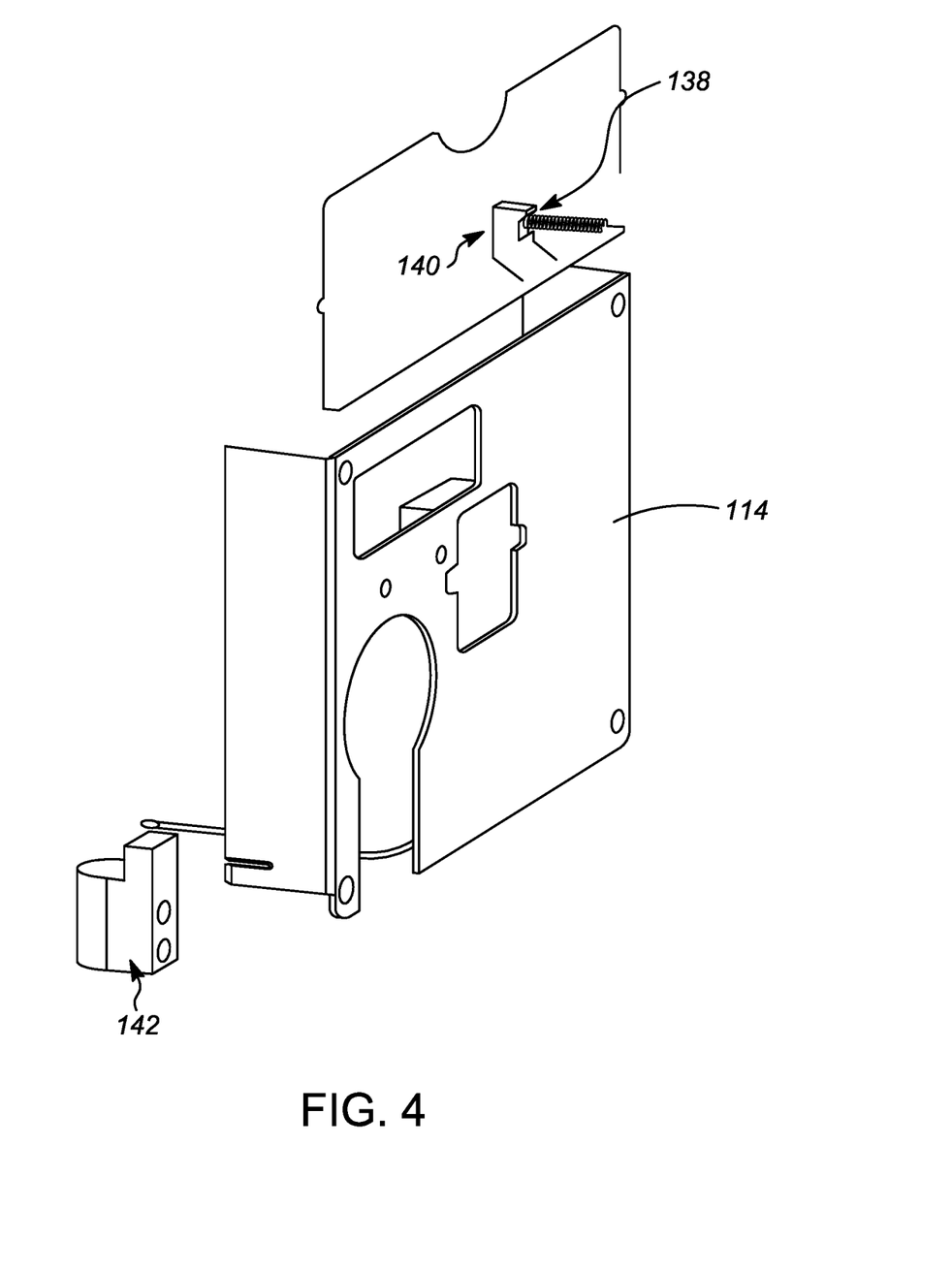
FIG. 4 illustrates an isometric view of the electrostatic discharge circuit formed within the smart meter, in accordance with an exemplary embodiment.

FIG. 4 4 illustrates an electrostatic discharge circuit according to an embodiment of the present disclosure. The electrostatic discharge circuit is comprised of wire 120, the electrical contact portion 136, a first connector 140, a metal shield 114 and a terminal 142. The wire 120 and the electrical contact portion 136, as described above are housed within the communication module cover 106.

The metal shield 114 as described above, is positioned behind the meter cover 102. The metal shield is further, electrically connected to a ground terminal 142. The electrical contact insulation chamber 134 extends up to the first connector 140 when the communications module cover 106 is mounted on the meter shell 102. The electrical contact insulation chamber 134 passes through the meter shell 102 to enable the tail end 138 to establish contact with the first connector 140.

The first connector 140 is electrically connected to the metal shield 114. In another embodiment, the first connector may be welded to the metal shield 114. The first connector 140 may be positioned on the metal shield, at a side such that it engages with the tail end 138, connected to coil spring of the electrical contact portion 136. The first connector 140 engages with the tail end 138 when the communications module cover is mounted on the meter shell 102. Various modifications may be made to metal shield 114 such that the first connector 140 establishes a durable contact with the tail end 138.

As the communication module cover 106 is mounted on the meter shell 102, the coil spring of the electrical contact portion 136, is configured to exert a spring force on the tail end 138. The tail end 138 as a result exerts a pressure on the first connector 140, thereby establishing a durable connection between the wire 120 and the metal shield 114.

The ground terminal 142 is connected to ground. The ground terminal 142 connected to the metal shield 114 forms the last constructional element of the electrostatic discharge path. In particular, during a tampering event, any electrical discharge transferred into the meter may develop voltages that are large enough to break down the internal circuitry i.e. circuit board on the meter or dissipate sufficient energy to cause electrothermal failures in the meter.

Such failures may include contact spiking, silicon melting, or metal interconnect melting. Accordingly, the electrostatic discharge circuit provided in this disclosure grounds any unwanted high voltage potentials induced to the energy meter from external sources. The disclosed ESD circuit effectively and safely bypasses externally applied high voltage potentials to ground protecting the meter from such disruptive attacks.

The present disclosure is directed to a modular electrostatic discharge circuit that is divided into three parts, a wire 120 formed within the wire housing 122, a metal shield 114 and a terminal 142. This electrostatic discharge circuit provides an easy discharge path for any externally applied voltage.

The disclosure therefore provides an ESD circuit equipped to protect the smart meter and also provide a two-part construction which helps access the communication module. The present disclosure help provide a meter case which is compact, sturdy and at the same time modular. Live wire functioning as an ESD circuit, is unsafe while accessing communication module in field.

The proposed disclosure where live wire along with the spring is isolated through isolation features created by plastic part boundaries, provides a safe working environment for the operator. The invention provides substantial manufacturing cost savings in the form of reduced and optimized materials, personnel hours and assembly operations. Moreover, the present disclosure provides a reliable and simple modular arrangement, where the operator accessing the communication module is safe and is not exposed to any part of the ESD circuit.

The prior art arrangement disclosed fixed or non-modular meter shells and covers, and do not address the issue of providing a safe construction of an ESD circuit within a meter which is not exposed. The circuit connection wherein the wire in the communication module is completed by virtue of the design itself, i.e. when the communication module cover is mounted on the meter shell.

The particular values and configurations discussed in these non-limiting examples can be varied and are cited merely to illustrate one or more embodiments and are not intended to limit the scope thereof.

Subject matter may, however, be embodied in a variety of different forms and, therefore, covered or claimed subject matter is intended to be construed as not being limited to any example embodiments set forth herein; example embodiments are provided merely to be illustrative.

Likewise, a reasonably broad scope for claimed or covered subject matter is intended. Among other issues, subject matter may be embodied as methods, devices, components, or systems. Accordingly, embodiments may, for example, take the form of hardware, software, firmware, or a combination thereof. The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense.

In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

While preferred embodiments have been shown and described, various modifications and substitutions may be made thereto without departing from the spirit and scope of the invention. Accordingly, it is to be understood that the present invention has been described by way of illustration and not limitation.

Specific Embodiments

While the following is described in conjunction with specific embodiments, it will be understood that this description is intended to illustrate and not limit the scope of the preceding description and the appended claims.

A first embodiment of the invention is a meter case used with a utility meter comprising a meter shell comprising a plurality of snap fit joints assembled on the meter case, a module cover configured to be mounted on the meter shell by engaging the plurality of snap fit joints, the module cover having a wire housing formed along an inner periphery of the module cover; a wire having a first end and a second end, mounted within the wire housing, a metal shield placed below the meter shell, the metal shield being electrically coupled to a first connector, and a terminal electrically connected to the metal shield configured to discharge current to ground. An electrical contact portion is provided, electrically coupled to the second end of the wire, the electrical contact portion is configured to engage the first connector to establish an electrical connection to the metal shield for the discharge to ground of electrostatic discharge current sensed by wire and an electrical contact insulation chamber formed within the module cover, for housing the electrical contact portion, the electrical contact insulation chamber having a recess. An embodiment of the invention is one, any or all of prior embodiments in this paragraph up through the first embodiment in this paragraph, wherein the electrical contact portion is configured to protrude from the module cover, the electrical contact portion comprising a coil spring housed in the recess, the coil spring electrically connected to the second end of the wire, and a tail end connected to the coil spring. An embodiment of the invention is one, any or all of prior embodiments in this paragraph up through the first embodiment in this paragraph, wherein the coil spring is configured to exert spring force to the tail end when the module cover is mounted on the meter casing. An embodiment of the invention is one, any or all of prior embodiments in this paragraph up through the first embodiment in this paragraph, wherein the tail end establishes contact with the first connector to transfer electrostatic current discharge to the terminal. An embodiment of the invention is one, any or all of prior embodiments in this paragraph up through the first embodiment in this paragraph, wherein the module cover is detachable from the meter shell through the snap fit joints. An embodiment of the invention is one, any or all of prior embodiments in this paragraph up through the first embodiment in this paragraph, wherein the electrical contact portion disengages as the module cover is detached from the meter shell. An embodiment of the invention is one, any or all of prior embodiments in this paragraph up through the first embodiment in this paragraph, wherein the recess formed in the electrical contact insulation chamber extends from the second end of the wire to the tail end. An embodiment of the invention is one, any or all of prior embodiments in this paragraph up through the first embodiment in this paragraph, wherein the wire housing is provided with a plurality of grooves and a plurality of locks. An embodiment of the invention is one, any or all of prior embodiments in this paragraph up through the first embodiment in this paragraph, wherein the plurality of grooves and plurality of locks arrest the movement of the wire.

A second embodiment of the invention is a method for assembling a case used with a utility meter, the method comprising providing a plurality of snap fit joints on a meter shell, mounting a module cover on the meter shell by engaging the plurality of snap fit joints, the module cover having a wire housing formed along an inner periphery of the module cover, laying a wire having a first end and a second end, within the wire housing along the inner periphery of the module cover; coupling electrically a metal shield placed below the meter shell, to a first connector; and providing a terminal electrically connected to the metal shield configured to discharge current to ground. The method further provides an electrical contact portion electrically coupled to the second end of the wire, the electrical contact portion is configured to engage with the first connector to establish an electrical connection to the metal shield for the discharge to ground of electrostatic discharge current sensed by the wire, and forming an electrical contact insulation chamber within the module cover, the insulation chamber providing a recess to house the electrical contact portion. An embodiment of the invention is one, any or all of prior embodiments in this paragraph up through the second embodiment in this paragraph, wherein the step of providing an electrical contact portion comprising providing a coil spring housed in the recess, electrically connected to the second end of the wire; and attaching a tail end to the coil spring. An embodiment of the invention is one, any or all of prior embodiments in this paragraph up through the second embodiment in this paragraph, wherein the coil spring exert spring force to the tail end when the module cover is mounted on the meter casing. An embodiment of the invention is one, any or all of prior embodiments in this paragraph up through the second embodiment in this paragraph, further comprises, detaching a module cover from the meter case by releasing the plurality snap fit joints. An embodiment of the invention is one, any or all of prior embodiments in this paragraph up through the second embodiment in this paragraph, wherein detaching a module cover from the meter case comprises disengaging the electrical contact portion from the first connector.

A third embodiment of the invention is a metering system, comprising a communication module configured to transmit and receive data from the network grid, a meter case comprising a plurality of snap fit joints, a module cover configured to shield the communication module, and mounted on the meter case by engaging the plurality of snap fit joints, the module cover having a wire housing formed along an inner periphery of the module cover, a wire having a first end and a second end, mounted within the wire housing, a metal shield placed below the meter case, the metal shield being electrically connected to a first connector. A terminal is also provided which is electrically connected to the metal shield configured to discharge current to ground. An electrical contact portion electrically coupled to the second end of the wire, the electrical contact portion is configured to engage the first connector to establish an electrical connection to the metal shield for the discharge to ground of electrostatic discharge current sensed by wire, and an electrical contact insulation chamber formed within the module cover, for housing the electrical contact portion. An embodiment of the invention is one, any or all of prior embodiments in this paragraph up through the third embodiment in this paragraph, wherein the electrical contact portion is configured to protrude from the module cover, the electrical contact portion comprising a coil spring housed in the recess, the coil spring electrically connected to the second end of the wire; and a tail end connected to the coil spring. An embodiment of the invention is one, any or all of prior embodiments in this paragraph up through the third embodiment in this paragraph, wherein the coil spring is configured to exert spring force to the tail end when the module cover is mounted on the meter casing. An embodiment of the invention is one, any or all of prior embodiments in this paragraph up through the third embodiment in this paragraph, wherein the tail end establishes contact with the first connector to transfer electrostatic discharge to the terminal. An embodiment of the invention is one, any or all of prior embodiments in this paragraph up through the third embodiment in this paragraph, wherein the module cover is detachable from the meter case through the snap fit joints. An embodiment of the invention is one, any or all of prior embodiments in this paragraph up through the third embodiment in this paragraph, wherein the electrical contact portion disengages as the module cover is detached from the meter case.

Without further elaboration, it is believed that using the preceding description that one skilled in the art can utilize the present invention to its fullest extent and easily ascertain the essential characteristics of this invention, without departing from the spirit and scope thereof, to make various changes and modifications of the invention and to adapt it to various usages and conditions. The preceding preferred specific embodiments are, therefore, to be construed as merely illustrative, and not limiting the remainder of the disclosure in any way whatsoever, and that it is intended to cover various modifications and equivalent arrangements included within the scope of the appended claims.

What is claimed is:

1. A meter case used with a utility meter comprising:
    a meter shell comprising a plurality of snap fit joints assembled on the meter case;
    a module cover configured to be mounted on the meter shell by engaging the plurality of snap fit joints, the module cover having a wire housing formed along an inner periphery of the module cover;
    a wire having a first end and a second end, mounted within the wire housing;
    a metal shield placed behind the meter shell, the metal shield being electrically coupled to a first connector;
    a terminal electrically connected to the metal shield is configured to discharge current to ground;
    an electrical contact portion, electrically coupled to the second end of the wire, the electrical contact portion is configured to engage the first connector to establish an electrical connection to the metal shield for the discharge to ground of electrostatic discharge current sensed by wire; and
    an electrical contact insulation chamber having a recess is formed within the module cover, the recess housing the electrical contact portion.

2. The meter case of claim 1, wherein the electrical contact portion is configured to protrude from the module cover, the electrical contact portion comprising:
    a coil spring housed in the recess, the coil spring electrically connected to the second end of the wire; and
    a tail end connected to the coil spring.

3. The meter case of claim 2, wherein the coil spring is configured to exert spring force to the tail end when the module cover is mounted on the meter case.

4. The meter case of claim 2, wherein the tail end establishes contact with the first connector to transfer electrostatic current discharge to the terminal.

5. The meter case of claim 1, wherein the module cover is detachable from the meter shell through the snap fit joints.

6. The meter case of claim 1, wherein the electrical contact portion disengages as the module cover is detached from the meter shell.

7. The meter case of claim 1, wherein the recess formed in the electrical contact insulation chamber extends from the second end of the wire to the tail end.

8. The meter case of claim 1, wherein the wire housing is provided with a plurality of grooves and a plurality of locks.

9. The meter case of claim 7, wherein the plurality of grooves and plurality of locks arrest the movement of the wire.

10. A method for assembling a meter case used with a utility meter, the method comprising:
providing a plurality of snap fit joints on a meter shell;
mounting a module cover on the meter shell by engaging the plurality of snap fit joints, the module cover having a wire housing formed along an inner periphery of the module cover;
laying a wire having a first end and a second end, within the wire housing;
coupling electrically a metal shield placed behind the meter shell, to a first connector;
providing a terminal electrically connected to the metal shield configured to discharge current to ground;
providing an electrical contact portion electrically coupled to the second end of the wire, the electrical contact portion configured to engage with the first connector to establish an electrical connection to the metal shield for the discharge to ground of electrostatic discharge current sensed by the wire; and
forming an electrical contact insulation chamber within the module cover, the insulation chamber providing a recess to house the electrical contact portion.

11. The method of claim 10, wherein the step of providing an electrical contact portion comprising:
providing a coil spring housed in the recess, electrically connected to the second end of the wire; and
attaching a tail end to the coil spring.

12. The method of claim 11, wherein the coil spring exert spring force to the tail end when the module cover is mounted on the meter case.

13. The method of claim 10, further comprises, detaching a module cover from the meter shell by releasing the plurality snap fit joints.

14. The method of claim 13, wherein detaching a module cover from the meter shell comprises disengaging the electrical contact portion from the first connector.

15. A metering system, comprising:
a communication module configured to transmit and receive data from the network grid;
a meter shell comprising a plurality of snap fit joints;
a module cover configured to shield the communication module has a wire housing formed along an inner periphery of the module cover, and is mounted on the meter shell by engaging the plurality of snap fit joints;
a wire having a first end and a second end is mounted within the wire housing;
a metal shield placed behind the meter shell is electrically connected to a first connector;
a terminal electrically connected to the metal shield is configured to discharge current to ground;
an electrical contact portion is electrically coupled to the second end of the wire, the electrical contact portion is configured to engage the first connector to establish an electrical connection to the metal shield for the discharge to ground of electrostatic discharge current sensed by wire; and
an electrical contact insulation chamber having a recess is formed within the module cover, the recess housing the electrical contact portion.

16. The metering system of claim 15, wherein the electrical contact portion is configured to protrude from the module cover, the electrical contact portion comprising:
a coil spring housed in the recess, the coil spring electrically connected to the second end of the wire; and
a tail end electrically connected to the coil spring.

17. The metering system of claim 15, wherein the coil spring is configured to exert spring force to the tail end when the module cover is mounted on the meter case.

18. The metering system of claim 16, wherein the tail end establishes contact with the first connector to transfer electrostatic discharge to the terminal.

19. The metering system of claim 15, wherein the module cover is detachable from the meter shell through the snap fit joints.

20. The metering system of claim 15, wherein the electrical contact portion disengages as the module cover is detached from the meter shell.

* * * * *